(12) United States Patent
Kelly et al.

(10) Patent No.: US 10,641,826 B2
(45) Date of Patent: May 5, 2020

(54) METHOD AND SYSTEM FOR DETECTING AND ISOLATING INTERMITTENCE IN MULTI-CIRCUIT CONNECTIVITY ELEMENTS

(71) Applicant: UNIVERSAL SYNAPTICS CORPORATION, Ogden, UT (US)

(72) Inventors: Patrick Kelly, Toy, UT (US); Jayson Kelly, Roy, UT (US); Brent Sorensen, Roy, UT (US); Paul Sorensen, Roy, UT (US)

(73) Assignee: UNIVERSAL SYNAPTICS CORPORATION, Ogden, UT (US)

( * ) Notice: Subject to any disclaimer, the term of this patent is extended or adjusted under 35 U.S.C. 154(b) by 164 days.

(21) Appl. No.: 15/900,133

(22) Filed: Feb. 20, 2018

(65) Prior Publication Data

US 2019/0257882 A1 Aug. 22, 2019

(51) Int. Cl.
*G01R 31/3185* (2006.01)
*G05B 19/042* (2006.01)
*G05B 23/02* (2006.01)
*G06F 11/22* (2006.01)

(52) U.S. Cl.
CPC . *G01R 31/318566* (2013.01); *G05B 19/0428* (2013.01); *G05B 23/0262* (2013.01); *G06F 11/2215* (2013.01)

(58) Field of Classification Search
CPC ........ G01R 31/318566; G06F 11/2215; G05B 19/0428; G05B 23/0262
See application file for complete search history.

(56) References Cited

U.S. PATENT DOCUMENTS

| 6,272,387 | B1 * | 8/2001 | Yoon | B60R 16/0207 700/17 |
| 7,368,919 | B2 * | 5/2008 | Gervais | G01R 31/021 324/503 |
| 2010/0268507 | A1 * | 10/2010 | Sorensen | G01R 31/021 702/120 |

* cited by examiner

*Primary Examiner* — Patrick Assouad
*Assistant Examiner* — Haidong Zhang
(74) *Attorney, Agent, or Firm* — Workman Nydegger (57) ABSTRACT

Embodiments are directed to identifying intermittent faults in a unit under test (UUT), and to mapping interconnections between connection points in a UUT. In one scenario, a testing apparatus includes an interface for electrically attaching the UUT to a testing module and an input circuit for supplying an individual stimulus signal to each unpowered connection point in the UUT. The testing apparatus also includes an active intermittence detecting circuit electronically connected to each connecting point in the UUT. A stimulus signal is applied simultaneously to each connecting line, so that an intermittent fault on any line will generate a trigger on those connection lines that have an intermittent fault. The testing apparatus also includes a logic circuit that determines when a trigger has been generated on the UUT, determines the connection point of the trigger, assigns a timestamp to the intermittent fault, and generates reporting data for the intermittent fault.

20 Claims, 6 Drawing Sheets

METHOD AND SYSTEM FOR DETECTING AND ISOLATING INTERMITTENCE IN MULTI-CIRCUIT CONNECTIVITY ELEMENTS

BACKGROUND

Airplanes, helicopters, rockets, satellites, ships, tanks, autonomous ground vehicles and other sophisticated machines-in-motion utilize complex guidance, control and other mission-critical electronics. In such systems, it is imperative that all of the components and their interconnecting pieces function reliably. It is known that electrical interconnections between components degrade and can malfunction over time. Degradation curves of electromechanical components suggest that intermittence, a state where a circuit experiences brief fluctuations in resistance will be the most likely failure mode first encountered. Constant failures in these systems are relatively easy to diagnose and repair.

Intermittent failures in these systems, however, are extremely difficult to detect, isolate and resolve. Traditional attempts to detect intermittent failures are generally performed using serial test methods which measure ohmic continuity, one circuit at a time, even when thousands of circuits are involved. The technologies typically employed such as Automatic Wire Testers (AWTs), Digital Multimeters (DMMs) and even Time Domain Reflectometry (TDR)) are fundamentally ineffective for detecting randomly occurring, low-level, intermittent faults. These technologies are designed to provide stable readings from a constantly failing circuit, and notably, all these continuity-type test technologies serially scan and/or test only one line or circuit at a time.

Conversely, intermittence by its very definition occurs randomly in time, duration and amplitude. In a complex system consisting of multiple circuits, the odds of an elusive intermittent failure occurring at the exact moment a serial scanning technology is actively measuring the failing circuit is infinitesimally small. While oscilloscopes are generally able to detect intermittence, their trigger can only be engaged on a single line or circuit at time so they too fail to perform when testing a multitude of circuits. Oscilloscopes also require an electrical stimulus on the line, making them largely impractical and unsuitable for testing hundreds or thousands of circuits and connection points.

BRIEF SUMMARY

Embodiments described herein are directed to systems, methods and apparatuses for identifying and isolating intermittent faults in a unit under test (UUT), and to automatically mapping the interconnections between connection points in a UUT. In one embodiment, a testing apparatus for identifying intermittent faults in a UUT includes an interface for electrically attaching the UUT to a testing module. Each UUT includes multiple connection lines that connect electronic components. The testing apparatus further includes an input circuit for supplying an individual stimulus signal to each unpowered connection point in the UUT, as well as an active intermittence detecting circuit electronically connected to each connecting point in the UUT. A stimulus signal is applied simultaneously to each connection line, such that an intermittent fault on any line will generate a trigger for those connection lines that are having intermittent faults.

The testing apparatus also includes a logic circuit configured to perform the following: determine when a trigger has been generated on the UUT, determine the connection point of the trigger on the UUT, assign a timestamp to the intermittent fault, and generate a packet of data corresponding to the intermittent fault for reporting to a controlling computer system.

In another embodiment, a method is provided for mapping interconnections between connection points in a UUT. The method includes accessing a test module with at least one UUT connected, where the UUT has multiple connection points. The method includes instantiating a database table with entries that list connections identified between the connection points. The database table is configured to store a resistance level measured at each connection point. The method further includes provisioning a switch at each connection point to automatically detect interconnections on the UUT. The switches are configured to identify which connection points in the circuit board are electrically connected. Furthermore, the method includes storing an indication of the identified interconnections in the database table entries, such that the UUT's interconnections are mapped and stored in the database table.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be apparent to one of ordinary skill in the art from the description, or may be learned by the practice of the teachings herein. Features and advantages of embodiments described herein may be realized and obtained by means of the instruments and combinations particularly pointed out in the appended claims. Features of the embodiments described herein will become more fully apparent from the following description and appended claims.

BRIEF DESCRIPTION OF THE DRAWINGS

To further clarify the above and other features of the embodiments described herein, a more particular description will be rendered by reference to the appended drawings. It is appreciated that these drawings depict only examples of the embodiments described herein and are therefore not to be considered limiting of its scope. The embodiments will be described and explained with additional specificity and detail through the use of the accompanying drawings in which.

DETAILED DESCRIPTION

As noted above, embodiments described herein are directed to systems, methods and apparatuses for identifying intermittent faults in a unit under test (UUT), and to mapping interconnections between connection points in a UUT. In one embodiment, a testing apparatus for identifying intermittent faults in a UUT includes an interface for electrically attaching the UUT to a testing module. Each UUT includes multiple connection lines that connect electronic components. The testing apparatus further includes an input circuit for supplying an individual stimulus signal to each unpowered connection point in the UUT, as well as an active intermittence detecting circuit electronically connected to each connecting point in the UUT. A stimulus signal is applied to each connecting line, such that an intermittent fault on any line will generate a trigger on those connection lines that have an intermittent fault.

The testing apparatus also includes a logic circuit configured to perform the following: determine when a trigger has been generated on the UUT, determine the connection point of the trigger on the UUT, assign a timestamp to the intermittent fault, and generate a packet of data corresponding to the intermittent fault for reporting to a controlling computer system.

In another embodiment, a method is provided for mapping interconnections between connection points in a UUT. The method includes accessing a test module with at least one UUT connected thereto, where the UUT has multiple connection points. The method includes instantiating a database table with database table entries that list connections identified between the connection points. The database table entries are configured to store a resistance level measured at each connection point. The method further includes provisioning a switch at each connection point to automatically detect interconnections on the UUT. The switches are configured to identify which connection points in the circuit board are electrically connected. Furthermore, the method includes storing an indication of the identified interconnections in the database table entries, such that the UUT's interconnections are mapped and stored in the database table.

Embodiments described herein may implement various types of electronic test equipment, including controlling computing systems. These computing systems may include computing devices of any kind, including stationary or mobile computing devices. Computing systems may, for example, include mobile phones, electronic appliances, laptop computers, tablet computers, wearable devices, desktop computers, mainframes, and the like. As used herein, the term "computing system" includes any device, system, or combination thereof that includes at least one processor, and a physical and tangible computer-readable memory capable of having thereon computer-executable instructions that are executable by the processor. A computing system may be distributed over a network environment and may include multiple constituent computing systems (e.g. a cloud computing environment). In a cloud computing environment, program modules may be located in both local and remote memory storage devices.

As described herein, a computing system may also contain wired or wireless communication channels that allow the computing system to communicate with other message processors over a wired or wireless network. Such communication channels may include hardware-based receivers, transmitters or transceivers, which are configured to receive data, transmit data or both. Embodiments described herein also include physical computer-readable media for carrying or storing computer-executable instructions and/or data structures. Such computer-readable media can be any available physical media that can be accessed by a general-purpose or special-purpose computing system.

Still further, system architectures described herein can include a plurality of independent components that each contribute to the functionality of the system as a whole. This modularity allows for increased flexibility when approaching issues of platform scalability and, to this end, provides a variety of advantages. System complexity and growth can be managed more easily through the use of smaller-scale parts with limited functional scope. Platform fault tolerance is enhanced through the use of these loosely coupled modules. Individual components can be grown incrementally as business needs dictate. Modular development also translates to decreased time to market for new functionality. New functionality can be added or subtracted without impacting the core system.

Figure 1:
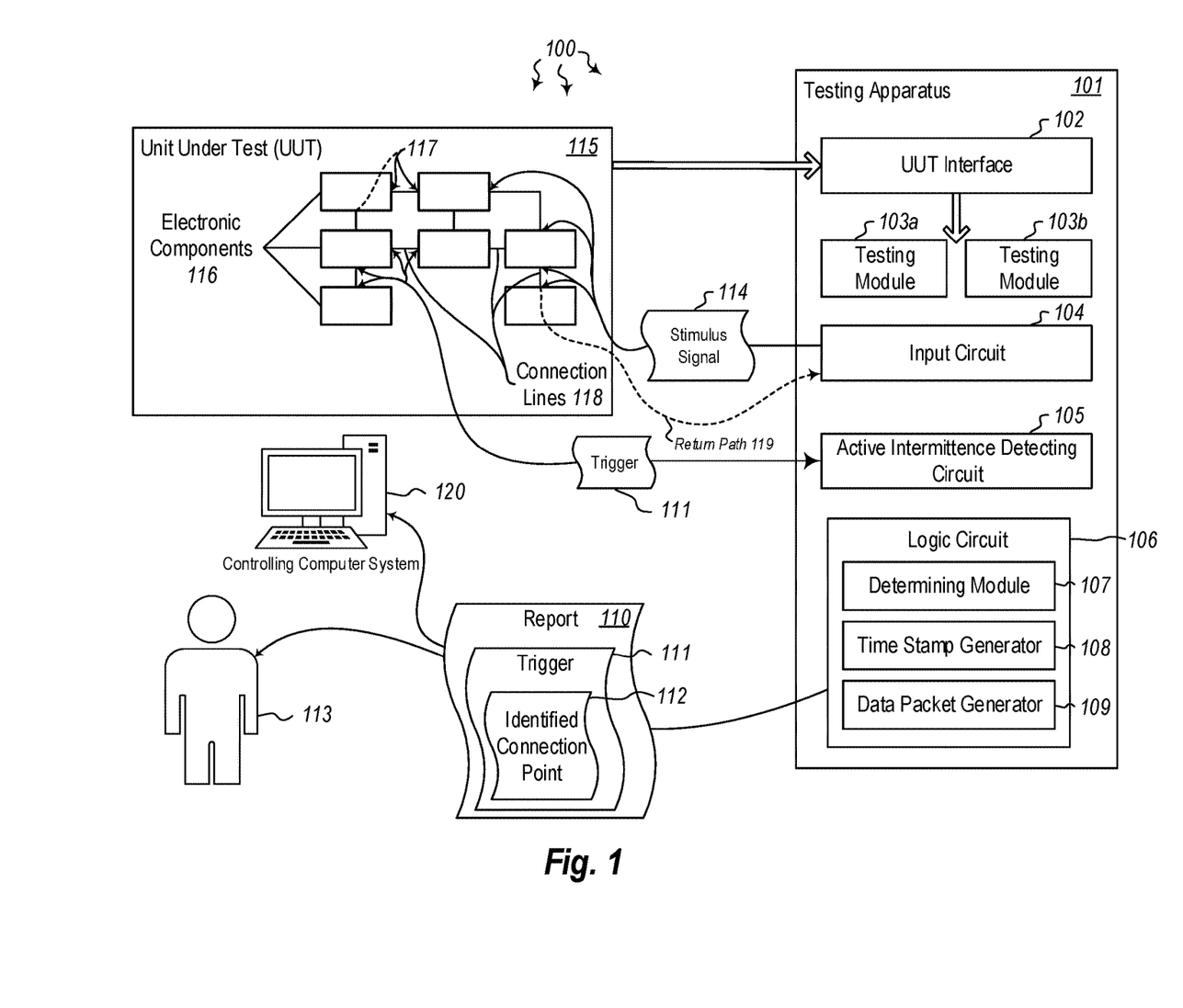
FIG. 1 illustrates a system architecture in which embodiments described herein may operate including identifying intermittent faults in a unit under test (UUT), and mapping interconnections between connection points in a UUT.

Referring now to the figures, FIG. 1 illustrates a system architecture 100 in which at least one embodiment described herein may be employed. The system architecture 100 includes a testing apparatus 101. The testing apparatus 101 may be implemented solely in hardware and/or firmware, or, in some cases, the testing apparatus may be implemented (at least partially) in software. The testing apparatus 101 includes various circuits, modules and interfaces for detecting intermittent faults in an electrical system. For example, a unit under test (UUT) (e.g. 115) may be examined for intermittent faults. UUTs, as used herein, refer to electronic units used in aircraft, missiles, ships, cars, or other mobile (or perhaps stationary) devices. The electronic units may include guidance systems, communications systems, user interface systems, control systems, telemetry systems or other types of electronic units. Alternatively, the electronic units may simply include the wiring in a system (e.g. an aircraft) that connects various electronic components. Each electronic unit or component may be tested individually or in combination with other components.

For example, as shown in FIG. 1, the testing apparatus 101 may implement a UUT interface 102 to access and test the UUT 115. The UUT has multiple different electronic components 116. Each of these electronic components 116 may be connected to other components via connection lines 118. Each connection terminus is referred to as a connection point (e.g. 117). In a typical system, if any of these electronic components 116, connection lines 118, or connection points 117 fails, all or part of the UUT will also fail. Thus, each component, connection line and connection point must be mechanically and electrically sound. This is especially true in situations where the UUT is mission critical (e.g. in flight control systems). Accordingly, the testing apparatus 101 is configured to identify even the smallest deviations from normal operation. Such deviations may include changes in resistance, voltage, amperage, capacitance, or other electrical property. This will be explained further below.

The UUT thus has many electronic components, connection lines and connection points. In the embodiments herein, each of these connection lines 118 and connection points 117 is tested simultaneously to ensure that no intermittent faults are missed. As part of the testing process, the UUT is electrically connected to the testing apparatus 101 using an interface 102. The UUT interface allows test modules (e.g. 103A/103B) to access the connection lines and connection points of the UUT 115. In cases where the UUT includes a large number of electronic components 116, more testing modules may be implemented within the testing apparatus 101. Input circuit 104 begins the testing process by sending a stimulus signal 114 to the connection lines 118 of the UUT 115. This stimulus signal allows changes (i.e. triggers 111) to be detected by the active intermittence detecting circuit 105.

When triggers 111 are detected by the active intermittence detecting circuit 105, the logic circuit 106 of the testing apparatus 101 performs various operations to identify where the trigger occurred. For instance, the trigger may occur on a certain connection line 118, or at a certain connection point 117, or within a certain electronic component 116. The logic circuit 106 implements determining module 107 to determine when a trigger has been generated on the UUT, and then determine the connection point (or other source) of the trigger. Once the location of the trigger has been identified, the timestamp generator 108 generates a timestamp indicating when the trigger occurred.

Then, the data packet generator 109 generates one or more data packets which include a report 110 identifying the trigger 111 and its determined connection point 112. This report 110 is sent to one or more users (e.g. user 113) and/or to one or more computing systems including the controlling computing system 120. These concepts will be discussed in greater detail below with regard to the schematic diagrams of FIGS. 2-3, and with regard to methods 600 and 700 of FIGS. 6 and 7, respectively.

Figure 2:
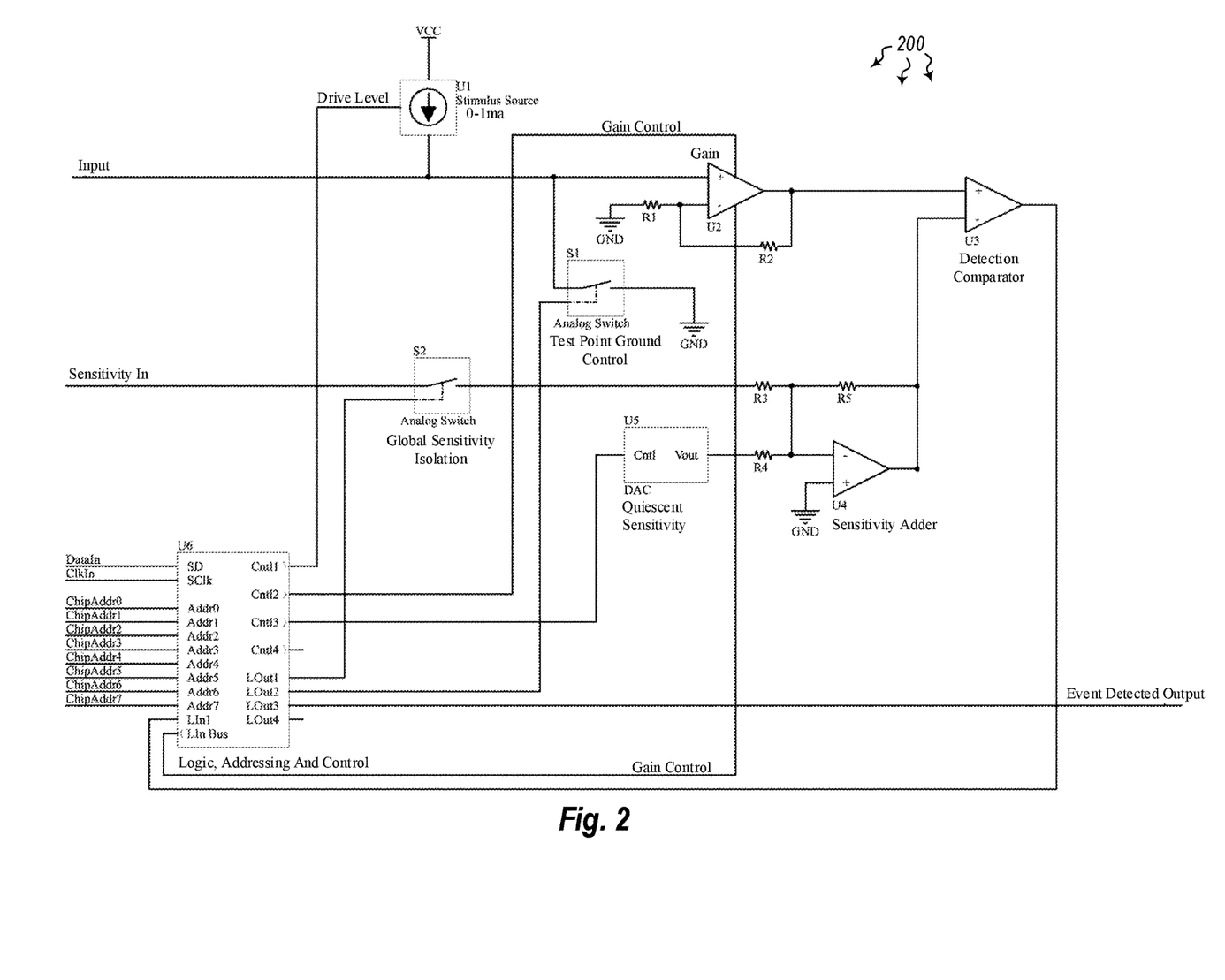
FIG. 2 illustrates an example schematic of an electrical system for identifying intermittent faults in UUT.

FIG. 2 illustrates an example schematic 200 of a circuit for detecting intermittent failures in a system. In at least some of the embodiments herein, intermittent fault detection is performed using an input circuit (e.g. 104 of FIG. 1) that is configured to supply a stimulus (114) to an unpowered circuit (UUT 115). The input circuit is also configured to provide a return path (119) for the stimulus and to respond quickly to any transient (i.e. trigger 111) generated by the intermittent failure. The input circuit then generates an output that can be used by the logic circuit 106. This input circuit 104 may be configured to handle a wide range of input transient magnitudes, both in amplitude and duration, and may further be configured to compensate for any quiescent voltage generated by the stimulus 114 on the unit under test 115.

In the embodiments herein, an active intermittence detection circuit 105 is provided on each and every line or point of the unit (i.e. circuit) under test for the full duration of the test. Any switching or scanning of the circuits under test by a reduced set of detector circuits will result in the probability of missing an event due to not being active on the line that the event occurs on when it occurs.

The schematic of FIG. 2 illustrates an input circuit for detecting intermittent connection events. U1 is a stimulus source circuit that may be either current- or voltage-based, and is controlled through the U6 logic element via the communication path. The stimulus source circuit (i.e. FIG. 1, input circuit 104) can be controlled individually or in large groups of input circuits. In FIG. 2, U2 is an amplifier that can have controlled gain, either externally or automatically, managed through the U6 logic element. A fixed gain option is also possible. The amplifier U2 presents the unit under test with a high impedance input for fast response and low loading, buffering the input for the detection comparator. The amplifier U2 also provides a specified amount of gain to increase sensitivity to small changes in resistance. In embodiments where automatic gain control is used, the amplifier U2 is allowed to function without saturation when presented with a large change on the input.

Continuing in the schematic 200 of FIG. 2, element U3 is a comparator for detecting when the input exceeds a set threshold. Element U4 is a buffer that adds a global sensitivity control signal to a local quiescent sensitivity control signal and presents the sum to the reference threshold input of the U3 comparator. Element U5 is a digital to analog converter (DAC) that is used to generate a reference level to match the quiescent level of the input. This allows the individual input to be at maximum sensitivity. Then, the global sensitivity input can control the sensitivity of the entire tester equally. This local sensitivity adjustment will be done automatically at a command sent to any or all inputs. The control of U5 is managed in the U6 logic element with commands sent in over the illustrated communication path.

U6 is a logic element that provides a communication path and addressing information for individual input control and configuration as well as an event flag line to report the detection of an event (i.e. a failure). The duration of the event is indicated by the length of time the input is above the threshold of the comparator and is signaled to the system controller by the duration of the event flag being active. This logic element may be programmable logic, microcontroller based, fixed logic or a combination thereof. The communication protocol may be a custom protocol, or may be an existing industry-standard protocol, or may be a customization thereof.

Figure 3:
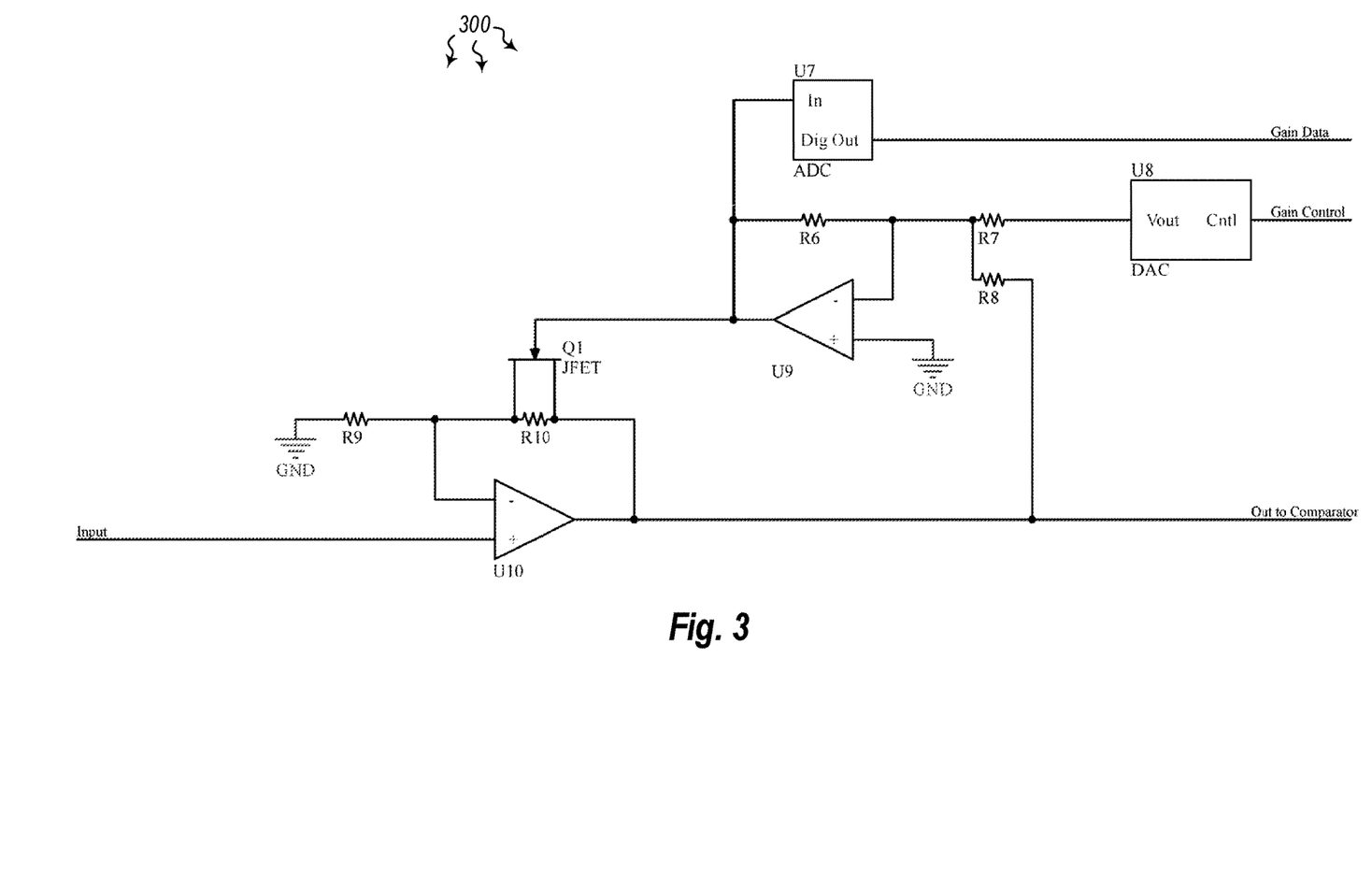
FIG. 3 illustrates an example schematic of an electrical system for automatically controlling gain.

Element S1 of FIG. 2 allows a user (e.g. 113 of FIG. 1) to program any input as a stimulus return path. S1 is controlled through a logic element (e.g. 106 of FIG. 1). Element S2 provides a way for the U6 logic element to disconnect the global sensitivity input for setting the local sensitivity level without concern for the setting of the global sensitivity input. Schematic 300 of FIG. 3 illustrates one possible implementation of an automatic gain control for the U2 amplifier of FIG. 2. Q1 may be configured to vary the resistance of the gain-setting resistor, R10, for FIG. 3, U10, while FIG. 3, U9 combines the gain control signal from DAC U8 with the output of the input amplifier U10. This combined signal is applied to Q1 as the gain control voltage, which may also be digitized and fed back to the logic element for use in controlling gain. As such, the combined signal can be read back by the system controller as data on an intermittence event. This data point can give some indication of the magnitude of the event.

Figure 4:
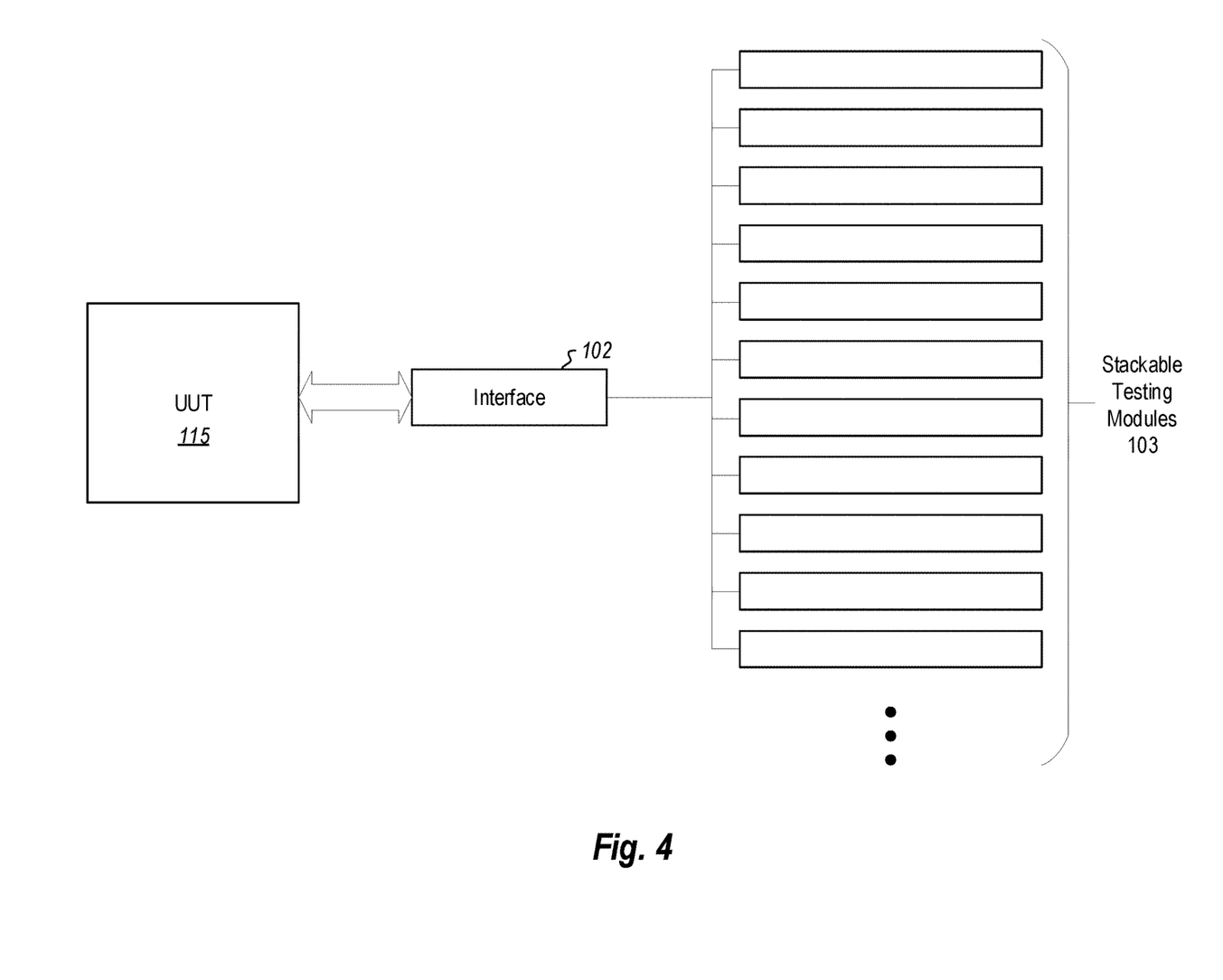
FIG. 4 illustrates an embodiment of a scalable system that adds testing modules to increase the number connection points tested.

In cases where the UUT has a large number of connection lines or connection points, multiple testing modules may be used. Indeed, as illustrated in FIG. 4, a testing apparatus may have a plurality of stackable testing module(s) 103. As indicated by the ellipses at the bottom of the stack of testing modules, there may be substantially any number of testing modules used to test a given unit under test (e.g. 115). In some cases, a single interface 102 may be used, or in other cases, multiple interfaces may be used to allow interaction between the UUT 115 and the testing modules 103. The interface 102 may be a hardware interface, software interface, firmware interface, or some combination thereof. The interface allows the testing modules to test all of the connection lines or connection points of the UUT at the same time, throughout the duration of the tests. This ensures that no intermittent failures pass through the test undetected.

In one specific embodiment, a testing apparatus for identifying intermittent faults in a UUT includes the components identified below. The UUT may be an electronics box chassis that includes a wiring harness. The UUT (e.g. 115) may include connections 118 made by any combination of wires and printed wiring board traces. This wiring may be flexible or rigid. In some cases, the units under test are connected to an electronics box chassis with any number of connections. If any connector, crimp, solder joint or other connection point is bad, the faulty connection will change impedance. This change in impedance is detectable by the testing apparatus 101 described herein.

The testing apparatus 101 has an interface 102 for electrically attaching at least one UUT to one or more testing modules 103A/103B. In some cases, the UUT interface 102 may be part of the testing modules. For instance, a testing module may be designed such that the UUT is designed to be physically placed therein, attaching to the testing module via the UUT interface 102. In other cases, the testing module and UUT may be physically separate from each other during testing, being only connected through the UUT interface 102.

Each UUT has one or more connection lines 118 that connect electronic components 116. These components 116 may be entire electrical systems, each system having its own set of sub-components, or they may be individual discrete components that are part of a single system. Substantially any number of electronic components 116 may be implemented in any given UUT. In this embodiment, the testing apparatus (e.g. 101) also has an input circuit 104. The input circuit supplies an individual stimulus signal 114 to each unpowered connection point 117 in the UUT 115.

An active intermittence detecting circuit 105 is electronically connected to each connecting point 117 in the UUT 115. The stimulus signal 114 generated by the input circuit 104 is applied to each connecting line 118 during the test. Then, if an intermittent fault occurs on any line, the detecting circuit 105 will detect the change in impedance and generate a trigger for those connection lines that have an intermittent fault. The active intermittence detecting circuit 105 is designed to be highly sensitive. In some cases, the active intermittence detecting circuit 105 is sensitive to changes down to approximately 1-2 Ohms, or less. The active intermittence detecting circuit(s) tests all connection lines continuously during the test to ensure that no intermittent faults are missed.

A stimulus signal is applied to each connection line 118 such that an intermittent fault on any line will generate a trigger on those connection lines that have an intermittent fault. For example, a 3V DC stimulus signal may be applied on each line by the input circuit 104. The result of an intermittent fault is a change in voltage, caused by the change in ohms on the faulty line. If the ohm level does not change, then no change in voltage will be generated. This Ohmic change causes a loss of integrity in the signal path that can disrupt the normal operation of the UUT, and the Ohmic change is detected by the active intermittence detecting circuit 105, generating a report to the operator that allows an effective repair to be performed.

The testing apparatus 101 also includes a logic circuit 106. The logic circuit may be any type or combination of hardware-, firmware- or software-based microprocessor or logic processing means capable of receiving an input, performing processing, and providing an output. The logic circuit 106 may be configured to determine when a trigger 111 has been generated on the UUT 115. The logic circuit 106 may further be configured to determine at which connection point 117 the trigger occurred on the UUT. By identifying which active intermittence detecting circuit identified the trigger, the logic circuit can use known information about the design of the UUT to determine where that particular active intermittent event is electrically and physically located. At least in some embodiments, determining the connection point of the trigger on the UUT may include identifying a coordinate-based location of the trigger on a faulting circuit. Thus, if multiple active intermittence detecting circuits form a matrix of sensors, the determining module 107 of the logic circuit 106 can identify an coordinate location (x,y) of the fault.

The logic circuit 106 can also assign a timestamp to the identified intermittent fault, and generate a packet of data corresponding to the intermittent fault for reporting to a controlling computer system. Such a data packet may include report 110, which identifies the trigger 111 and the connection point 112 at which the trigger occurred. This report may be sent to a controlling computer system 120 and/or to users such as user 113. In some cases, units may be tested in environmental chambers which are configured to vary the temperature, humidity or other settings. This environmental chamber data may be included in the report sent to the controlling computer system 120 or user 113.

During the testing performed by the testing apparatus 101, the input circuit 104 generates one or more stimulus signals (e.g. 114). The input circuit 104 may be configured to provide a return path 119 for the stimulus signal. This provides a complete circuit that allows the stimulus current to flow. The input circuit may be further configured to handle a certain range of input signals. For instance, the input circuit 104 may be designed to handle a specified range of transient magnitudes, both in amplitude and duration. The input circuit may further be configured to compensate for any quiescent voltage generated by the stimulus signal on the UUT 115. Once the stimulus has been applied to the UUT, the input circuit can be commanded by the controlling computer system 120 to self-calibrate so that the global sensitivity control will manage the sensitivity of all the inputs identically. Thus, if the level of quiescent voltage on any connection line rises above the threshold level set by the global sensitivity setting, the active intermittence detecting circuit 105 will respond and a trigger will be generated.

When an intermittent fault has been detected, the logic circuit 104 of the testing apparatus 101 may be configured to characterize the amplitude and/or duration of the fault. For instance, when the active intermittence detecting circuit 105 detects the occurrence of an intermittent fault, the logic circuit may determine the amplitude and/or duration of the fault. The fault may produce a high-level trigger, or a low-level trigger. The fault may last for a relatively long time, or a short amount of time. The testing apparatus 101 can not only detect when an intermittent fault occurs, and determine where the fault occurred on the unit under test 115, the testing apparatus can also determine the amplitude of the fault and/or the duration of the fault. This information may be stored in a report (e.g. 110) in conjunction with each fault. Thus, for each fault, an amplitude level and/or duration may be reported, along with a timestamp indicating when the fault occurred. This information may be sent to the controlling computer system 120, which can then use the information as feedback to control the testing apparatus 101.

The logic circuit 106 may be an integrated circuit (IC) that is programmable. The logic circuit may work in tandem with the input circuit 104 and the active intermittence detecting circuit to provide a stimulus signal, provide a return path for the signal, provide an amplifier stage with gain control which feeds a comparator to detect the triggers when faults occur. The circuits of the testing apparatus are designed to stimulate multiple lines together, where a voltage is provided on the input so that the stimulus signal gets through the amplifier stage with gain and gets to the comparator. The comparator reference is set to be slightly above quiescent level, so that it will not trigger at quiescent level, but will trigger when quiescent level has been exceeded. By self-calibrating to the quiescent level, a very high level of sensitivity is provided, as anything above the quiescent level is identified as a fault. If a given voltage reference level or sensitivity is too noisy, the global sensitivity control voltage may be raised to compensate for the noise.

Each individual test point may have its own preset quiescent reference level. Using the reference level, the logic circuit may perform the self-calibration by running the initial voltage level up until the comparator does not register a trigger. The value of the voltage level can then be read back and stored for use when testing other UUTs of the same type with unknown serviceability. The output from the comparator is sent to a field programmable gate array (FPGA) (or other chip with multiple inputs) with programmable logic. The timestamp generator 108 attaches a time reference when a trigger is identified. This data is stored in a data store, which is updated as new triggers are detected. This data may be stored for each connection point (e.g. each pin) in the UUT. Thus, by using active intermittence detection circuits electrically connected to every connection line or connection point of the UUT for the full duration of the test, even very small and very brief intermittent faults may be detected.

Figure 5:
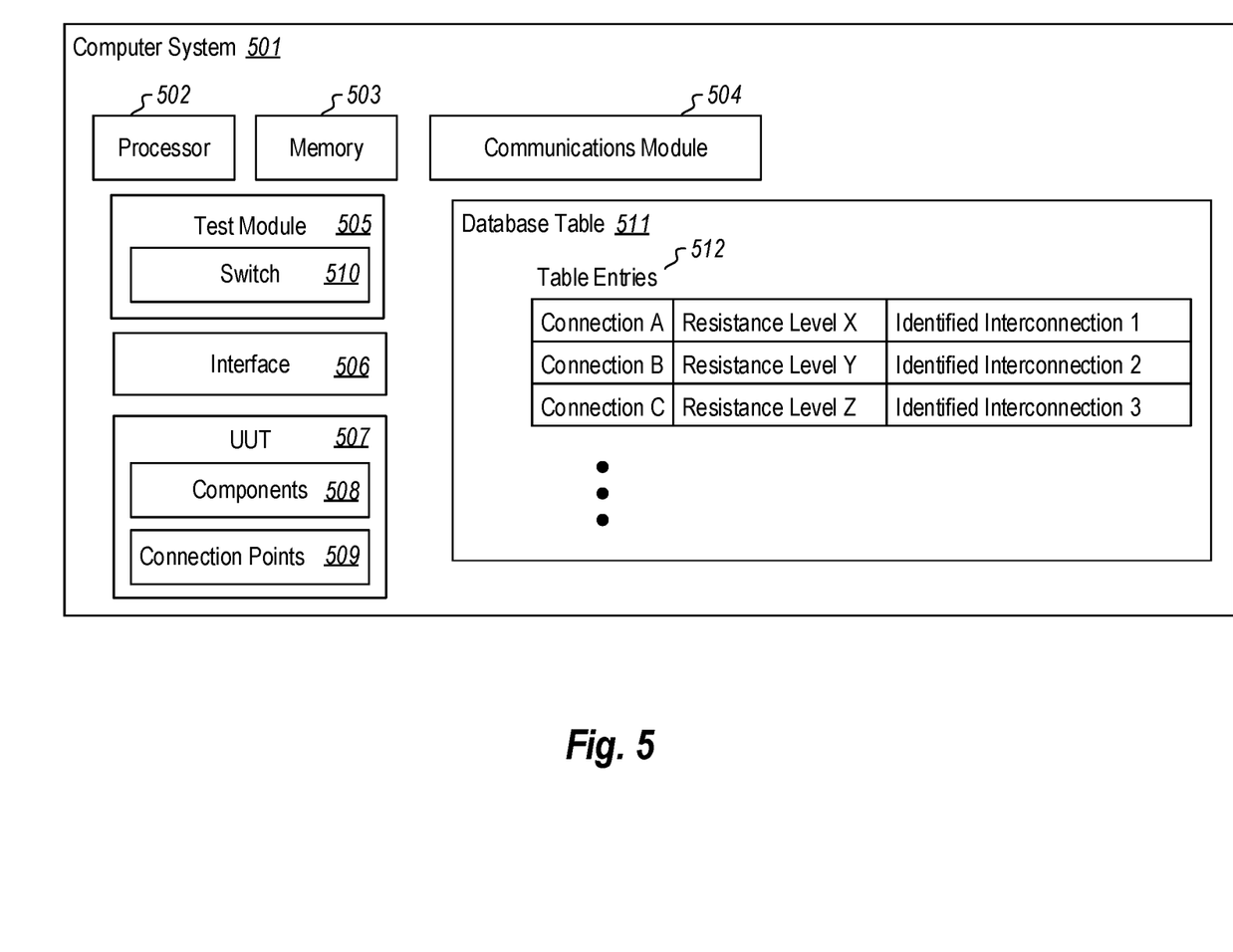
FIG. 5 illustrates a system architecture in which embodiments described herein may operate including mapping interconnections between connection points in a UUT.

Turning now to FIG. 5, a computer system is provided for mapping interconnections between connection points in a unit under test. As noted above, a unit under test may have many electronic components and many connection points. In at least some embodiments herein, the connection points are mapped using a computer system such as computer system 501 of FIG. 5. The computer system 501 includes at least one processor 502 and at least some system memory 503. The computer system 501 may be any type of local or distributed computer system, including anything from an FPGA to a cloud computing system. The computer system 501 includes modules for performing a variety of different functions. For instance, communications module 504 may be configured to communicate with other local or remote computer systems. The communications module 504 may include any wired or wireless communication means that can receive and/or transmit data to or from other computer systems. The communications module 504 may be configured to interact with databases, mobile computing devices (such as mobile phones or tablets), embedded or other types of computer systems.

The computer system 501 further includes a test module 505 with an interface 506 for communication with a unit under test. UUT 507, for example, may be connected to test module 505 via interface 506. As in the examples above, the test module 505 may include the UUT, or may be connected to an external UUT via the interface 506. The UUT has one or more electronic components 508. These components are connected via connection points 509. Switches 510, or other types of circuits, may be provisioned at each connection point in order to detect interconnections in the UUT. Once the interconnections have been identified, they may be stored in a database table 511. Each table entry (e.g. 512) may identify the connection, a detected resistance level, and an identified interconnection with other connection points. Thus, Connection A may have a Resistance Level X, and an Identified Interconnection 1, while Connection B may have a Resistance Level Y, and an Identified Interconnection 2, and so on. As indicated by the ellipses, a database table may contain substantially any number of table entries. The way in which interconnections are mapped is explained further below with regard to method 600 of FIG. 6.

Figure 6:
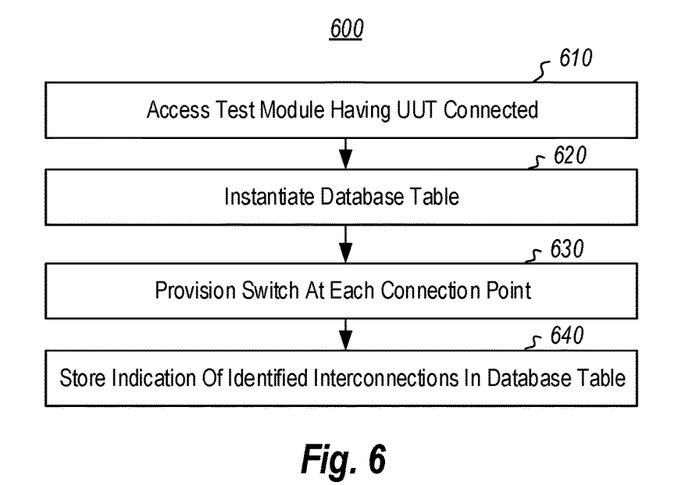
FIG. 6 illustrates a flowchart of a method for mapping interconnections between connection points in a UUT.

In view of the systems and architectures described above, methodologies that may be implemented in accordance with the disclosed subject matter will be better appreciated with reference to the flow charts of FIG. 6. For purposes of simplicity of explanation, the methodologies are shown and described as a series of blocks. However, it should be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

FIG. 6 illustrates a flowchart of a method 600 for mapping interconnections between connection points in a unit under test (UUT). The method 600 will now be described with frequent reference to the components and data of FIG. 5.

Method 600 includes accessing a test module comprising at least one UUT, the UUT comprising one or more connection points (610). The computer system 501, for example, may access test module 505. The test module may include or at least have access to unit under test 507. The UUT 507 has one or more components 508, each having one or more connection points 509. The computer system 501 may also instantiate a database table 511 with one or more database table entries 512 configured to list connections identified between the connection points 509 (620). The database table entries are configured to store a resistance level measured at each connection point (620). This resistance level may be measured for each connection point at an initial measuring, and then may be updated at later times. The initial measuring may provide a reference or normal level at each connection points. Any deviations from this normal level may be identified as potential intermittent faults.

Method 600 further includes provisioning a switch 510 at each connection point to automatically detect interconnections on the UUT 507 (630). The switches 510 are configured to identify which connection points in the circuit board are electrically connected (630). Such interconnections may include pins, traces, connecting wires, solder joints or other locations where electrical connections link electronic components. Using the interface 506, the test module may access the UUT connection lines and connection points to identify where interconnections exist. The computer system 501 then stores indications of the identified interconnections in the database table entries 512 (640). As such, UUT interconnections are mapped and stored in the database table (640). Different database tables may be generated for each UUT that is tested.

Using this method, interconnections of the UUT may be detected without having knowledge of the actual internal connections of the UUT. Thus, even without schematics, or without prior knowledge of which components or connection points exist in a given UUT, the method 600 may be used to identify these interconnections and note them in a database. In traditional testing scenarios, detailed knowledge about the UUT is required in order to properly determine where interconnections exist in the UUT. Using the methods described herein, however, no knowledge regarding the UUT and its components is needed.

The test module 505 is configured to use switches placed on each connection line to identify and record a normal resistance level for each connection point. This normal resistance level is then used to identify relative differences between connection points, and verify that the UUT interconnections are correct. The interconnections of the UUT are detected without implementing software programming steps that are specific to the UUT that is being tested. Again, in traditional testing scenarios, test managers or computer systems need to have a detailed software program outlined with discrete steps that are to be taken in order to identify interconnections.

In the embodiments herein, a switch 510 is provisioned in the Test Module 505 connected to each connection point in the UUT. These switches allow the computer system to automatically detect interconnections on the UUT 507 and map them to a database table. The computer system may also be configured to identify which pin(s) on the UUT will provide a return path for each of the identified interconnections. Such knowledge about return paths in the UUT may be used when determining intermittent faults in the unit under test.

Figure 7:
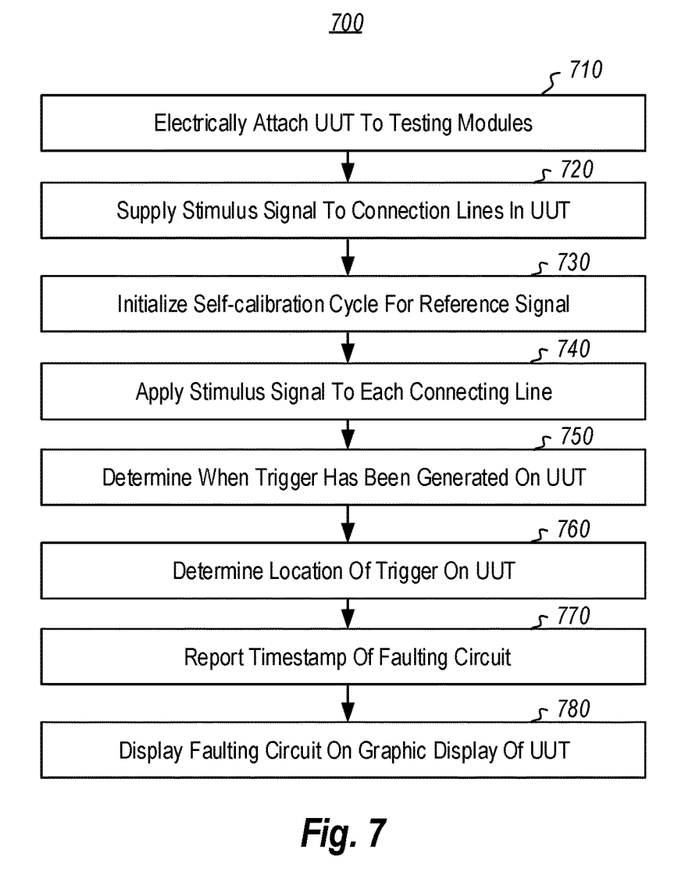
FIG. 7 illustrates a flowchart of a method for identifying intermittent faults in a UUT.

FIG. 7 illustrates a flowchart of a method 700 for detecting intermittent faults in a system. The method 700 will now be described with frequent reference to the components and data of environment 100.

Method 700 includes electrically attaching at least one unit under test to one or more testing modules (710). Each UUT includes multiple connection lines configured to connect electronic components. For example, a user or machine may electrically attach UUT 115 to testing module 103A and/or 103B via UUT interface 102. Each UUT has electronic components 116 which are connected via connection lines 118. Once connected to the testing modules, the input circuit 104 provides a stimulus signal 114 to one or more unpowered connection lines 118 in the UUT (720). The stimulus signal 114 is applied to all of the connection lines in the UUT at the same time. If some connection lines are not tested during the test, one cannot be sure that all intermittent faults have been found. By testing all of the connection lines continuously throughout the test, very minor fluctuations in electrical properties can be detected. These fluctuations enable the logic circuit 106 to identify where the intermittent fault lies.

Method 700 further includes initializing a self-calibration cycle of a reference signal, such that the reference signal calibrates itself to a specified level (730). A reference signal may be used to determine a baseline, normal level for a connection line or set of connection lines or connection points. The reference signal may be calibrated automatically during a self-calibration cycle. Quiescent voltage levels are detected and compensated for, such that any changes beyond a specified level are identified as faults. This reference level thus indicates the point beyond which a fluctuation in electrical properties will be categorized as a fault. It should be noted here that the reference level may change over time. For instance, if faults are erroneously being detected at a high rate, the reference level may be low, whereas if faults are not being identified when they should be, the reference level may be too high. In such cases, the reference level may be adjusted to ensure that false positives and false negatives are minimized. As part of the initial test configuration of the UUT, the local calibrated reference level may be read back and stored as part of the UUT setup and applied when the tester is configured to test the UUT again.

Method 700 next includes applying the stimulus signal to each connecting line such that an intermittent fault on any line will generate a trigger on those connection lines that have an intermittent fault (740). The trigger 111 is detected by an active intermittence detecting circuit 105. Multiple such circuits may be used to detect intermittent faults on the UUT 115. The determining module 107 of the logic circuit 106 determines that a trigger has been generated on the UUT (750), and determines the location of the trigger on the UUT (760). The trigger location identifies a faulting circuit or series of circuits. The timestamp generator 108 of the logic circuit 106 generates a timestamp identifying the time of the event, which with the location of the faulting circuit and associated data related to the intermittent fault (770) is assembled into the report 110 and sent to the controlling computer system 120. The faulting circuit (or at least a location thereof) is displayed on a graphic display of the UUT 115, allowing an operator to view the fault and repair it (780). For example, user 113 may view the display of the faulting circuit, identify its location and repair the fault.

In some cases, additional information about the fault may be provided. This may include information about electronic components located near the fault, information about connection lines or connection points near the fault, information indicating the function of certain connection lines or components that might be affected by the fault, or other information. Any or all of this information may be included in the report 110 sent to the user 113 and/or the controlling computer system 120.

Accordingly, methods, systems and computer program products are provided which identify intermittent faults in a unit under test. Active intermittence detection circuits may be placed on every connection line of the unit under test for the full duration of the test, such that each connection line of the system is monitored simultaneously by the logic circuit of the system. By monitoring all of the connection lines all of the time, the fault detection system can ensure that no intermittent faults are missed, no matter how small the faults are. This high level of accuracy in detection is crucial when identifying and fixing faults in aircraft controllers or other electrical equipment that performs mission critical functions. The embodiments herein ensure that all types of faults are identified and logged so that they can be repaired before returning the UUT to operation.

The concepts and features described herein may be embodied in other specific forms without departing from their spirit or descriptive characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

We claim:

1. A testing apparatus for identifying transient connection conditions constituting intermittent faults on connecting paths within a unit under test (UUT), the testing apparatus comprising:
a set of one or more testing modules, each testing module comprising:
a set of stimulus circuits that are individually controllable as a source or sink of stimulus signals and are individually electrically connectable to one or more connection points in the UUT; and
a set of intermittence-detecting circuits that are individually electrically connectable to each of the one or more connection points in the UUT;
a logic circuit configured to perform the following:
determine when a transient event has occurred at any one of the set of intermittence-detecting circuits to thereby trigger the testing apparatus;
determine the one or more connection points within the UUT that triggered the testing apparatus to thereby identify an intermittent fault;

assign a timestamp to each identified intermittent fault; and generate a set of data defining each intermittent fault for reporting to a testing apparatus controller; and an interface for electrically attaching at least one UUT to one or more of the set of testing modules, each UUT comprising a plurality of connection lines configured to connect electronic components.

2. The testing apparatus of claim 1, wherein the set of stimulus circuits are configured to return paths for the stimulus signals.

3. The testing apparatus of claim 1, wherein reference signals of the intermittence-detecting circuits are self-calibrating as commanded by the testing apparatus controller.

4. The testing apparatus of claim 1, wherein the logic circuit is further configured to characterize the amplitude and/or duration of each identified intermittent fault.

5. The testing apparatus of claim 4, wherein the amplitude and/or duration of each identified intermittent fault is reported to the testing apparatus controller as part of the set of data for each intermittent fault.

6. The testing apparatus of claim 1, wherein each intermittence-detecting circuit is configured to handle at least a specified range of input transient magnitudes, both in amplitude and duration.

7. The testing apparatus of claim 6, wherein each intermittence-detecting circuit is configured to compensate for any quiescent voltage generated by the stimulus signals on the UUT.

8. The testing apparatus of claim 1, wherein determining the one or more connection points within the UUT causing the trigger comprises identifying a coordinate-based location of the trigger generated by a faulting circuit.

9. The testing apparatus of claim 1, wherein the testing apparatus is implemented solely in hardware and/or firmware.

10. The testing apparatus of claim 1, wherein the set of one or more testing modules are stackable to accommodate a plurality of connection test points.

11. The testing apparatus of claim 1, wherein the intermittence-detecting circuits are electrically connected to every connection line or connection point of the UUT for the full duration of the test.

12. A method of mapping interconnections between connection points in a unit under test (UUT), the method comprising:

accessing a test module comprising at least one UUT, the UUT comprising one or more connection points;

instantiating a database table with one or more database table entries configured to list connections identified between the connection points, wherein the database table entries are configured to store a resistance level measured at each connection point;

provisioning a switch connected to each connection point to automatically detect interconnections on the UUT, the switches being configured to identify which connection points in the circuit board are electrically connected; and storing an indication of the identified interconnections in the database table entries, such that the UUT's interconnections are mapped and stored in the database table.

13. The method of claim 12, further comprising storing the measured and recorded resistance level for each connection point of a known good UUT in the data storage system.

14. The method of claim 12, further comprising identifying which pin(s) on the UUT will provide a return path for each of the identified interconnections.

15. The method of claim 12, wherein the interconnections of the UUT are detected without knowledge of the actual internal connections of the UUT that is being tested.

16. The method of claim 12, wherein the interconnections of the UUT are detected without implementing software programming steps that are specific to the UUT that is being tested.

17. A method, performed at a computer system including at least one processor and a memory, for detecting intermittent faults in a system, the method comprising:

electrically attaching at least one unit under test (UUT) to one or more testing modules, each UUT comprising a plurality of connection lines configured to connect electronic components;

supplying a stimulus signal to one or more connection lines in the UUT;

initializing a self-calibration cycle of a reference signal, such that the reference signal calibrates itself to a quiescent input level;

determining when a trigger has been generated on the UUT, the generated trigger identifying an intermittent fault;

determining the location of the trigger on the UUT, the trigger location identifying a faulting circuit that has the intermittent fault;

reporting a timestamp of the faulting circuit event along with one or more portions of associated data related to the intermittent fault; and displaying the faulting circuit on a graphic display of the UUT, allowing an operator to view the fault and repair it.

18. The method of claim 17, further comprising reporting one or more portions of associated data related to the detected intermittent fault along with the reported timestamp.

19. The method of claim 17, wherein an active intermittence detection circuit is on every connection line of the UUT for the full duration of the test.

20. The method of claim 19, wherein each connection line of the system is monitored simultaneously by control logic in the system.

* * * * *